United States Patent
Adams, III

(10) Patent No.: US 7,043,325 B1
(45) Date of Patent: May 9, 2006

(54) METHOD AND APPARATUS FOR DETERMINING PRODUCT-SPECIFIC ERROR AND TOOL DRIFT

(75) Inventor: Ernest Adams, III, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/069,872

(22) Filed: Mar. 1, 2005

(51) Int. Cl.
*G06F 19/00* (2006.01)

(52) U.S. Cl. ...................................... 700/109

(58) Field of Classification Search ............ 700/28–32, 700/105, 108–111, 117–121; 438/14–18
See application file for complete search history.

(56) References Cited

U.S. PATENT DOCUMENTS

| | | | |
|---|---|---|---|
| 6,350,179 B1* | 2/2002 | Campbell et al. ............. 451/41 |
| 6,424,881 B1* | 7/2002 | Steffan et al. ............... 700/121 |
| 6,428,673 B1* | 8/2002 | Ritzdorf et al. ............... 205/84 |
| 6,546,508 B1* | 4/2003 | Sonderman et al. .......... 714/48 |
| 6,763,278 B1* | 7/2004 | Coss et al. ................... 700/108 |
| 6,890,773 B1* | 5/2005 | Stewart ........................ 438/14 |
| 2003/0216827 A1* | 11/2003 | Mouli ........................... 700/97 |
| 2004/0102857 A1* | 5/2004 | Markle et al. ................ 700/2 |
| 2004/0220693 A1* | 11/2004 | Mouli ........................... 700/121 |
| 2005/0192698 A1* | 9/2005 | Cheng et al. ................ 700/121 |

* cited by examiner

*Primary Examiner*—Maria N. Von Buhr
(74) *Attorney, Agent, or Firm*—Williams Morgan & Amerson

(57) ABSTRACT

The present invention provides a method and apparatus for determining product-specific model errors. The method includes determining a plurality of product model errors associated with a corresponding one of a plurality of products. The method also includes determining at least one input parameter for a process model to be used in processing a workpiece to form one of the plurality of products based upon the product model error associated with the product to be formed on the workpiece.

26 Claims, 4 Drawing Sheets

METHOD AND APPARATUS FOR DETERMINING PRODUCT-SPECIFIC ERROR AND TOOL DRIFT

BACKGROUND OF THE INVENTION

1. Field of the Invention

This invention relates generally to the field of semiconductor device manufacturing and, more particularly, to a method and apparatus for determining product-specific error and tool drift.

2. Description of the Related Art

A variety of processing tools are used to fabricate a semiconductor device. The processing tools may include photolithography steppers, etch tools, deposition tools, polishing tools, rapid thermal processing tools, ion implantation tools, and the like. Wafers (or wafer lots) are processed in the tools in a predetermined order and each processing tool modifies the wafers according to a particular operating recipe. For example, a photolithography stepper may be used to form a patterned layer of photoresist above the wafer. Features in the patterned layer of photoresist correspond to a plurality of features, e.g. gate electrode structures, which will ultimately be formed above the surface of the wafer. For another example, a deposition tool may be used to form a layer of material above the wafer or above gate electrode structures that have been formed on the wafer.

The operating recipe may be determined using a process model that relates one or more input parameters associated with the processing tool with one or more output parameters. For example, a thickness of the deposited layer (T) may be related to a deposition time (t) by the process model equation $T=Rt$, where R is the deposition rate associated with the deposition tool. Input parameters of the processing tools are selected to attempt to achieve a desired target value for the output parameters. For example, the deposition tool may have a deposition rate of approximately 50 angstroms per second. Accordingly, a deposition time of approximately four seconds may be selected so that the thickness of the deposited layer is approximately equal to a desired target value for the thickness of 200 angstroms. The parameters of the process model may change as the process tool is used to process additional lots of wafers due to a phenomenon known as "tool drift." For example, the deposition rate of a deposition tool may decrease as additional lots of wafers are processed in the deposition tool. Conventional processing tools may estimate the associated process tool drift and use this estimate to modify the parameters of the process model as additional lots of wafers are processed.

Measured values of the output parameters typically differ from the values predicted by the process model. For example, after four seconds, the deposition tool having a nominal deposition rate of 50 angstroms per second may have only deposited a layer that is 192 angstroms thick, as opposed to the target thickness of 200 angstroms. The difference between the measured values of the output parameters and the values predicted by the process model is referred to as the model error. The portion of the model error associated with the process tool may also vary as the process tool is used to process additional lots of wafers, at least in part because of the tool drift. Thus, the portion of the model error associated with the process tool is commonly referred to as the "tool drift error."

The model error may also vary between different products processed in the process tool. For example, a processing tool may be used to produce multiple versions of a 64 MB flash memory device. The different versions of the flash memory device, i.e. the different products, may utilize a different layout of individual gate features, may have a different density of the features, may implement the memory elements using different structures, and the like. Although the deposition rate of the deposition tool should remain approximately constant, variations in the underlying structure may cause the thickness of the deposited layer to vary. For example, the thickness of a layer deposited over a relatively dense array of features in a given time period may be larger than the thickness of a layer deposited over a relatively sparse array of features in the same time period. Thus, the model error associated with the product having the relatively sparse array of features may be larger that the model error associated with the product having the relatively dense array of features.

In many cases, conventional process models assume that the model error is due to random noise, which averages to zero and can therefore be ignored. Alternatively, the model error due to random noise may be calculated and included in the model. However, conventional process models cannot distinguish between product errors and tool errors. Consequently, if the process tool is used to process wafers for more than one product, the accuracy of the process model may be reduced for at least some of the products. For example, partially processed wafers associated with first and second products may be processed by a deposition tool having an approximately constant deposition rate. However, the thickness of a layer formed on the partially processed wafer associated with the first product may be less than the thickness of a layer formed on the partially processed wafer associated with the second product because the first and second products have different product errors.

Since the conventional process models described above cannot distinguish between product errors and tool errors, the process models cannot be adjusted to compensate strictly for product-to-product variations or tool drift in the model errors. Consequently, errors in the thickness of the layers formed by the deposition tool may be increased by the failure to account for the product-specific variations in the model errors, which may decrease the efficiency of the processing tool and the associated fabrication process.

The present invention is directed to addressing the effects of one or more of the problems set forth above.

SUMMARY OF THE INVENTION

In one embodiment of the present invention, a method is provided for determining product-specific model errors. The method includes determining a plurality of product model errors associated with a corresponding one of a plurality of products. The method also includes determining at least one input parameter for a process model to be used in processing a workpiece to form one of the plurality of products based upon the product model error associated with the product to be formed on the workpiece. In other embodiments of the present invention, apparatuses for implementing the method are provided.

BRIEF DESCRIPTION OF THE DRAWINGS

The invention may be understood by reference to the following description taken in conjunction with the accompanying drawings, in which like reference numerals identify like elements, and in which.

Figure 1:
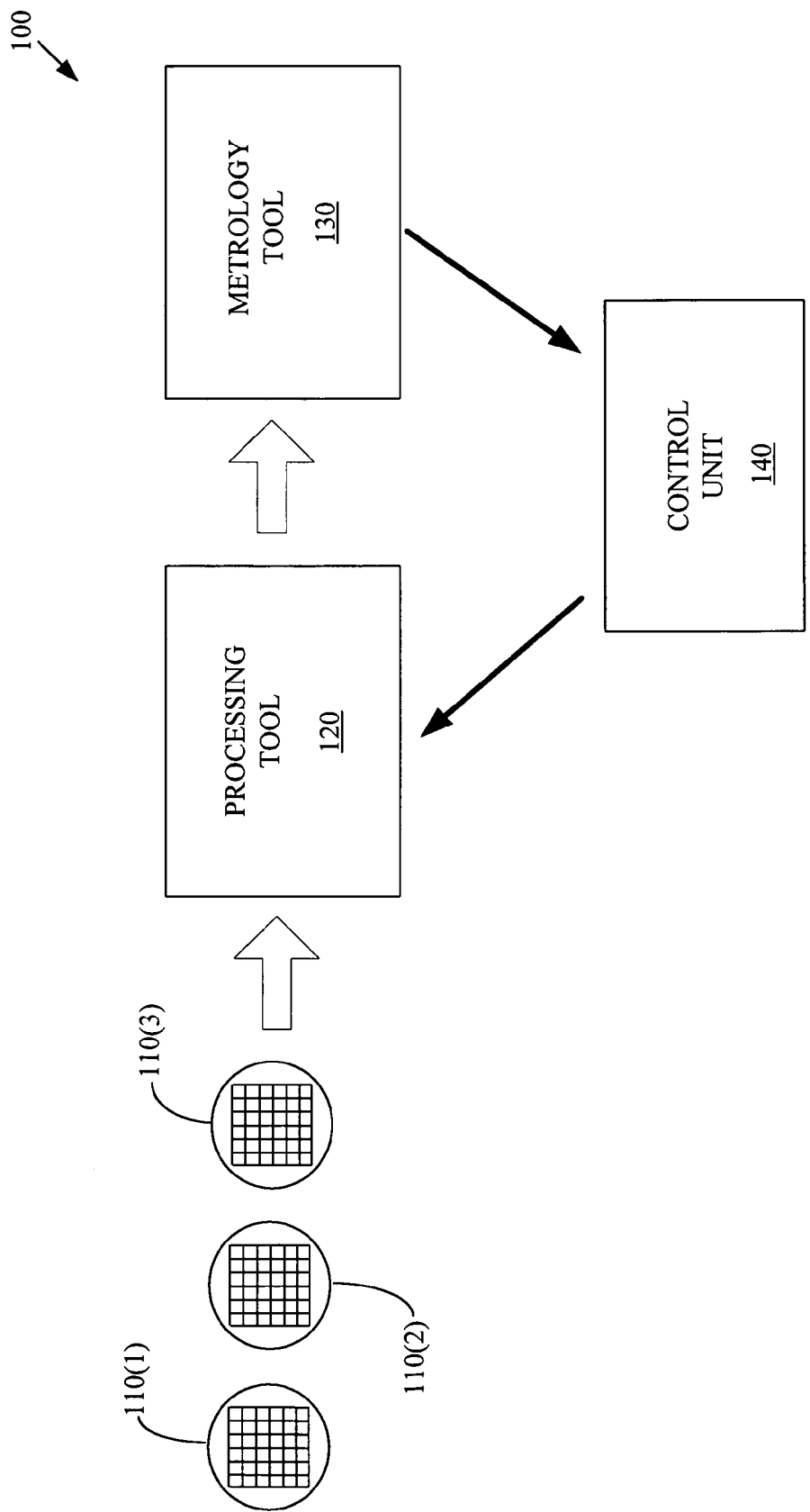
FIG. 1 conceptually illustrates a system for processing semiconductor workpieces, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates a system 100 for processing semiconductor workpieces 110(1–3). In various alternative embodiments, the workpieces 110(1–3) may be wafers, wafer lots, a batch of wafer lots, or any other desirable type of semiconductor workpiece. The workpieces 110(1–3) shown in FIG. 1 may be at any desirable stage of processing. For example, the workpieces 110(1–3) may include wafers that are substantially unprocessed. Alternatively, the workpieces 110(1–3) may include wafers that have been processed in other processing tools not shown in FIG. 1. Although three workpieces 110(1–3) are shown in FIG. 1, persons of ordinary skill in the art should appreciate that the three workpieces 110(1–3) are shown to indicate that a plurality of workpieces 110(1–3) may be processed by the system 100. However, the present invention is not limited to any particular number of workpieces 110(1–3).

Each of the workpieces 110(1–3) are used to form one of a plurality of products. In one embodiment, the workpiece 110(1) may be used to form a first product such as a first version of a flash memory device, the workpiece 110(2) may be used to form a second product such as a second version of a flash memory device, and the workpiece 110(3) may be used to form a third product such as an EEPROM memory device. However, persons of ordinary skill in the art should appreciate that the present invention is not limited to any particular product that may be formed on the workpieces 110(1–3).

The workpieces 110(1–3) are provided to a processing tool 120. In various alternative embodiments, the workpieces 110(1–3) may be provided to the processing tool individually or in groups of any desirable size. The processing tool 120 may be any desirable type processing tool, such as a photolithography stepper, an etch tool, a deposition tool, a polishing tool, a rapid thermal processing tool, an ion implantation tool, and the like. As will be discussed in detail below, the processing tool 120 is controlled to process the workpieces 110(1–3) according to a process model to form a desired one of the plurality of products. For example, the processing tool 120 may be configured to perform a portion of the processing required to form flash or EEPROM memory devices on the workpieces 110(1–3).

The processed workpieces 110(1–3) are provided to a metrology tool 130. For example, the processed workpieces 110(1–3) may be provided to a scatterometer, an ellipsometer, or any other desirable type of metrology tool 130. Although the metrology tool 130 is depicted as a separate entity in FIG. 1, this is not intended to limit the present invention. In various alternative embodiments, the metrology tool 130 may be an integrated metrology tool 130 that is physically coupled to the processing tool 120 or the metrology tool 130 may be a separate entity that is not physically coupled to the processing tool, such as a stand-alone metrology tool 130. The metrology tool 130 is configured to perform one or more measurements of one or more output parameters associated with the workpieces 110(1–3). For example, the metrology tool 130 may be a scatterometer that is configured to measure one or more critical dimensions of one or more features formed on the workpieces 110(1–3). For another example, the metrology tool 130 may be an ellipsometer configured to measure a thickness of a layer formed on the workpieces 110(1–3).

Figure 2A:
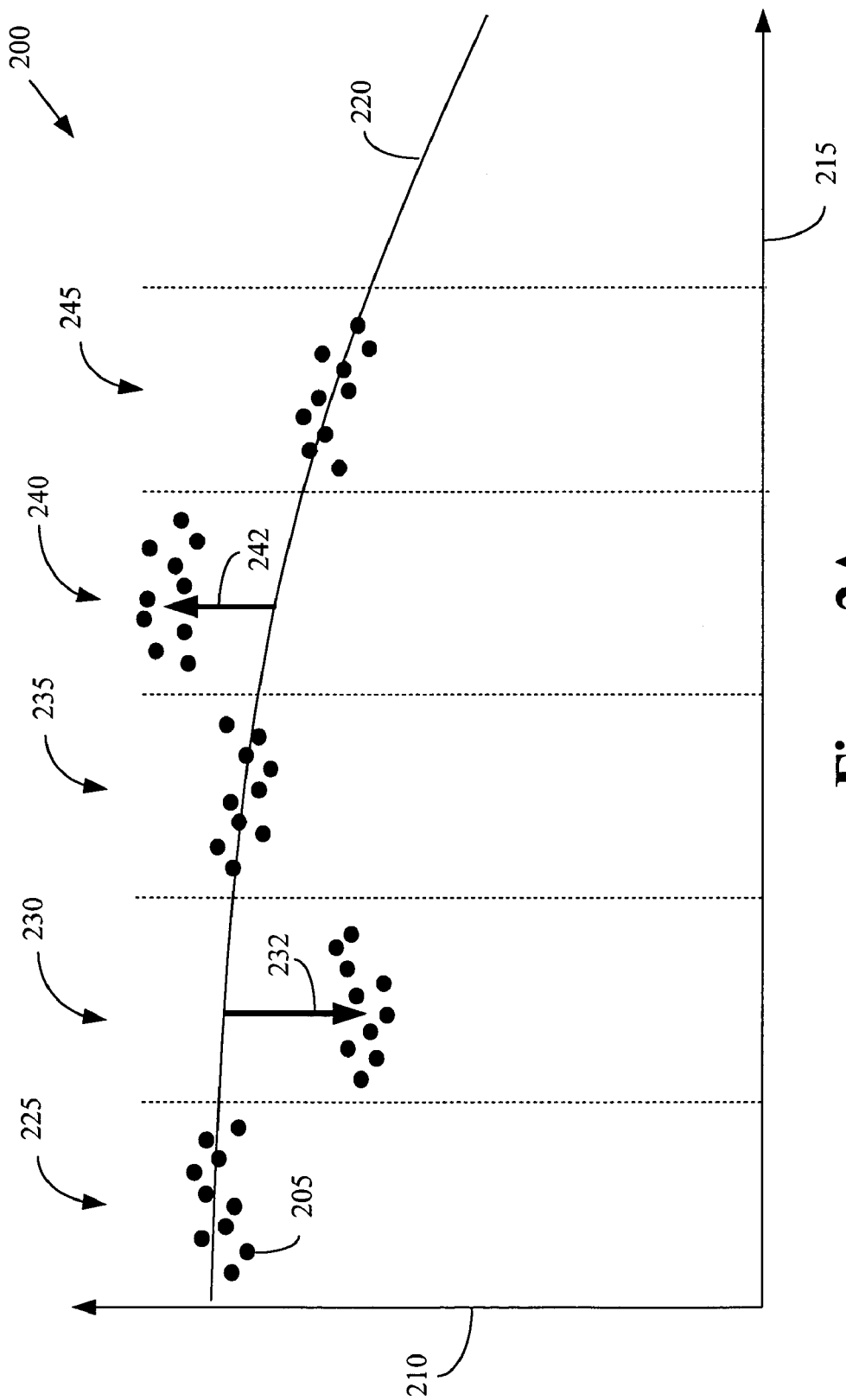
FIG. 2A conceptually illustrates a scatter diagram of measured output parameters associated with workpieces that are used to form a plurality of products according to a process model.

FIG. 2A conceptually illustrates a scatter diagram 200 of a plurality of measured output parameters 205 (only one indicated) associated with workpieces, such as the workpieces 110(1–3) shown in FIG. 1, that are used to form a plurality of products. Persons of ordinary skill in the art should appreciate that any desirable output parameters 205 may be used. In one embodiment, the output parameters 205 are physical quantities, such as a layer thickness, a critical dimension, and the like, that are measured at a single location on a single wafer. However, the present invention is not limited to output parameters 205 that reflect a single measurement. In alternative embodiments, the output parameter may be formed using multiple measurements at a plurality of locations and/or from a plurality of wafers or wafer lots. For example, the output parameters 205 may be average values, such as an average of a plurality of thickness measurements taken at different portions of the layer or from layers formed on different workpieces. For another example, the output parameters 205 may be some other function of multiple measurements, such as a slope of a thickness or a thickness variability parameter.

The scatter diagram 200 includes an axis 210 indicative of an amplitude of the measured output parameter 205. The scatter diagram 200 also includes an axis 215 indicative of the sequence of workpieces processed in a processing tool, such as the processing tool 120 shown in FIG. 1. For example, the axis 215 may be indicative of a time, a wafer number, a wafer lot number, and the like. Although the scatter diagram 200 shown in FIG. 2A is a 2-dimensional diagram, the present invention is not limited to 2-dimensional scatter diagrams 200. In alternative embodiments, the scatter diagram 200 may include any desirable number of dimensions corresponding to any desirable number of output parameters.

A process model of the output parameter (indicated by model line 220) is shown in the scatter diagram 200. The model line 220 is determined based upon one or more input parameters of the process model. For example, if the scatter diagram 200 shows results of a thickness measurement following a deposition process performed in a deposition tool, then the model line 200 indicates the process model prediction for the thickness of a layer formed by depositing material at a deposition rate for a deposition time. In this example, a simple process model equation for the thickness T=Rt (or T=Rt+Error) may be used. The deposition rate (R) is generally determined by the deposition tool, the deposition time (t) is an input parameter, and the thickness measurement (T) is an output parameter. However, persons of ordinary skill in the art should appreciate that other input parameters may be provided to the process model. For example, a gas flow rate, a gas pressure, a gas composition, and the like may be provided to the deposition process model.

The model line 200 also reflects a tool drift that causes the predicted output parameter to decline with increasing time and/or number of processed workpieces. For example, the thickness of a layer deposited by a deposition tool during a prescribed deposition time may decrease as the number of processed wafers increases. However, the present invention is not limited to tool drifts that reduce the amplitude of the output parameter over time. In alternative embodiments, the model line 200 may stay approximately flat, may increase, may vary non-monotonically or may vary in some other non-linear fashion.

The scatter diagram 200 includes output parameters 205 collected from workpieces that are processed to form a plurality of products according to a process model having one or more input parameters. In the embodiment illustrated in FIG. 2A, the input parameters are the same for all of the output parameters 205. The measured output parameters 205 shown in the region 225 correspond to measurements taken from workpieces that are processed to form a first product. The measured output parameters 205 in the region 225 are approximately randomly scattered about the model line 220. The measured output parameters 205 shown in the region 230 correspond to measurements taken from workpieces that are processed to form a second product. At least in part due to differences between the first and second products, the measured output parameters 205 the region 230 are displaced below the model line 220 by a mean error $-\Delta_1$, indicated by the arrow 232, and are approximately randomly scattered about a location displaced from the model line 220 by the mean error $-\Delta_1$.

The measured output parameters 205 shown in the region 235 correspond to measurements taken from workpieces that are processed to form the first product and are approximately randomly scattered about the model line 220. The measured output parameters 205 shown in the region 240 correspond to measurements taken from workpieces that are processed to form a third product. At least in part due to differences between the first and third products, the measured output parameters 205 the region 240 are displaced above the model line 220 by a mean error $\Delta_2$, indicated by the arrow 242 and are approximately randomly scattered about a location displaced from the model line 220 by the mean error $\Delta_2$. The measured output parameters 205 shown in the region 245 correspond to measurements taken from workpieces that are processed to form the first product and are approximately randomly scattered about the model line 220. The mean errors $\Delta_1$ and $\Delta_2$ may have any sign and the absolute values of the mean errors $\Delta_1$ and $\Delta_2$ may vary and are not necessarily equal.

Referring back to FIG. 1, the control unit 140 is configured to determine portions of a plurality of model errors associated with each of a corresponding a plurality of products, i.e. product-specific model errors, as will be discussed in detail below. For example, the control unit 140 may use output parameters associated with previously processed workpieces to determine that a mean model error associated with the first product is approximately zero, a mean model error associated with the second product is approximately $-\Delta_1$, and a mean model error associated with the third product is approximately $\Delta_2$. The control unit 140 then determines at least one process model input parameter based on the product-specific model errors. For example, the process model input parameters may include various deposition times, etch times, anneal temperatures, and the like. The determined process model input parameters are provided to the processing tool 120, which uses the at least one input parameter to form one of the plurality of products.

Figure 2B:
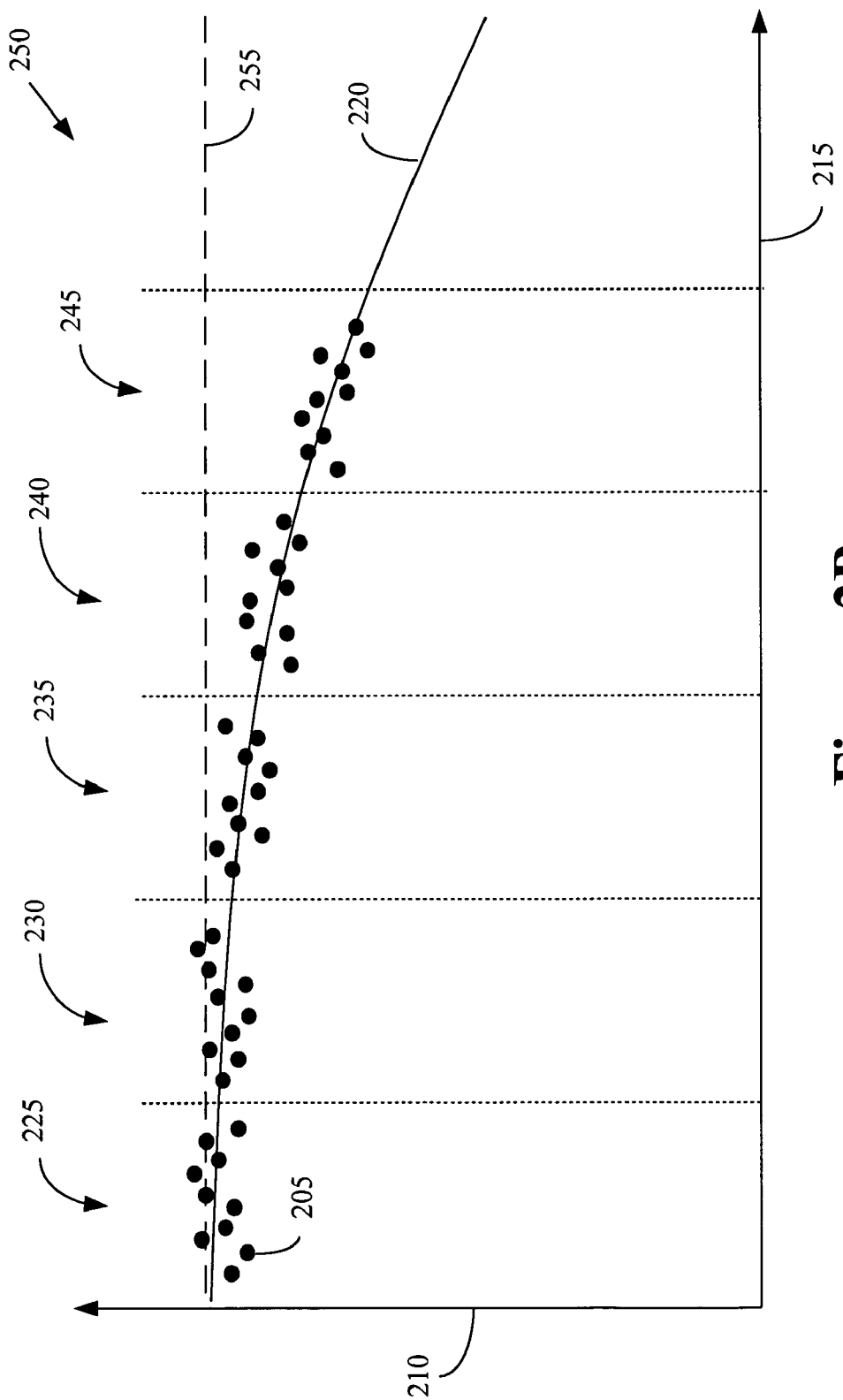
FIG. 2B conceptually illustrates a scatter diagram of measured output parameters associated with workpieces that are used to form a plurality of products according to a process model based on product-specific model errors, in accordance with the present invention.

FIG. 2B conceptually illustrates a scatter diagram 250 of measured output parameters 205 (only one indicated) associated with workpieces that are used to form a plurality of products. In the illustrated embodiment, the input parameters for the process model are determined, at least in part, using product-specific model errors. The measured output parameters 205 in the regions 225, 230, 235, 240, 245 are approximately randomly scattered about the model line 220. Thus, errors in the measured output parameters 205 associated with a plurality of products, as well as variability of the measured output parameters 205 may be reduced by determining the input parameters based upon product-specific model errors. Moreover, the efficiency of the processing tool and the associated fabrication process may be increased.

The input parameters for the process model may also be determined, at least in part, using a desired target value of one or more output parameters, as indicated by the dashed line 255. In the illustrated embodiment, tool drift causes the model line 220 to decline at increasing tool usage times and/or numbers of workpieces processed. The input parameters for the process model may therefore be determined so that the measured output parameters 205 in the regions 225, 230, 235, 240, 245 are approximately randomly scattered about the desired target value line 255. For example, the thickness of a layer deposited in a deposition tool during a given deposition time period may decrease as the number of workpieces processed in the deposition tool (or the tool usage time) increases. However, it may be desirable to attempt to maintain a target thickness of the deposited layer. Accordingly, the deposition time may be increased as the number of workpieces processed in the deposition tool increases (or as the tool usage time increase) so that the measured thicknesses are approximately randomly scattered about the desired target value.

Figure 3:
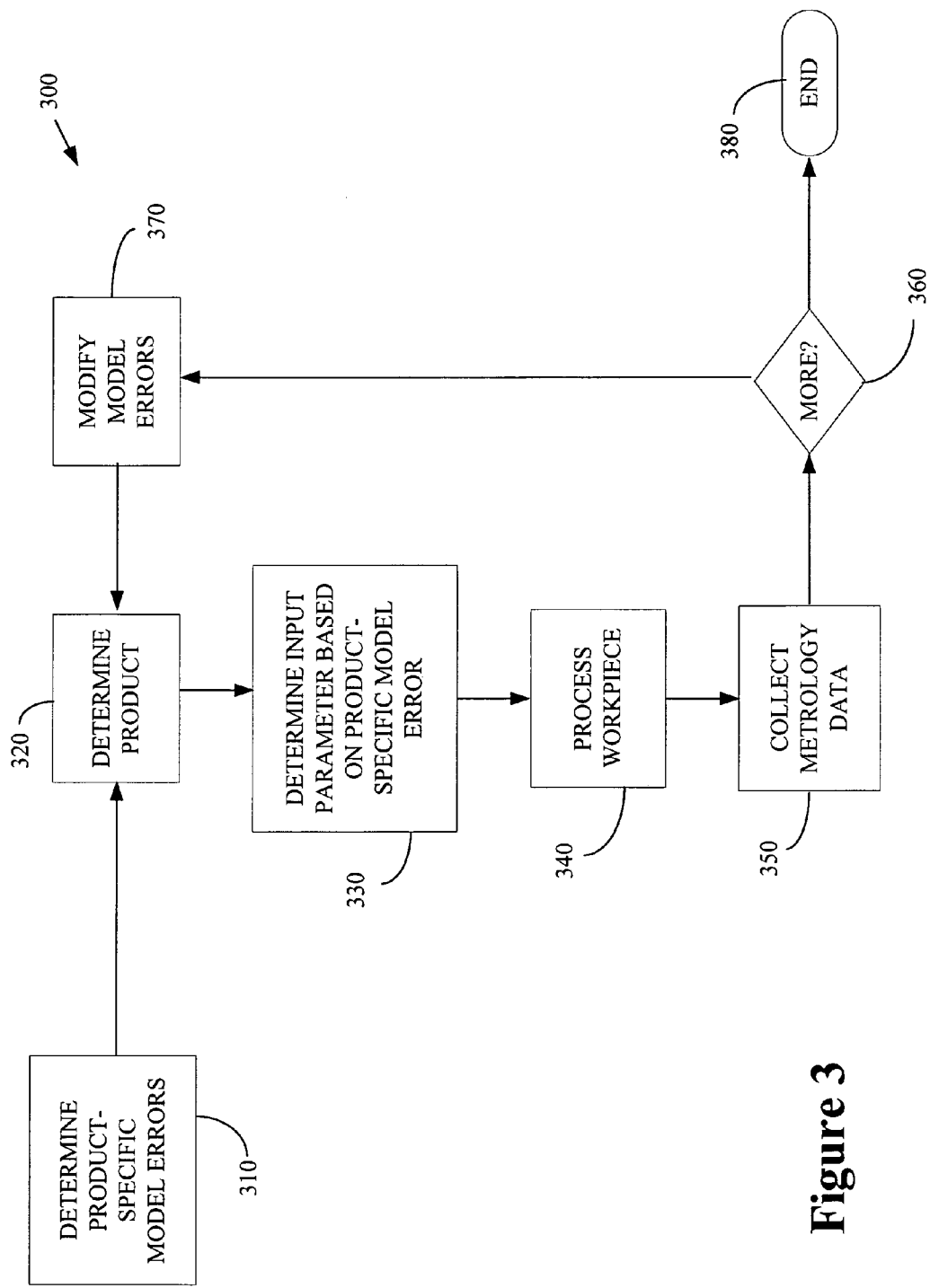
FIG. 3 conceptually illustrates a method of processing workpieces to form a plurality of products, in accordance with the present invention.

FIG. 3 conceptually illustrates a method 300 of processing workpieces to form a plurality of products, in accordance with the present invention. One or more product-specific model errors are determined (at 310). In one embodiment, the product-specific model errors are determined (at 310) by applying an auto-regressive fit to previously acquired data where error is the output and the inputs are qualitative. For example, the product-specific model errors, $\epsilon$, may be determined (at 310) using the equation:

$$\varepsilon = \sum_{i=0}^{N} \beta_i P_i + e,$$

where $\beta_i$ are model coefficients, or biases, associated with each product indicated by the index i, and the variables $P_i$ are qualitative values. For example, the variables $P_i$ may be Boolean variables (0, 1) or other integer values. The auto-regressive term, $e_t = \rho e_{t-1} + u_t$, where et is the residual error for the run, t, $\rho$ is a slope, and U, is a calculated offset, may be used to account for drift in the product-specific model errors. However, the present invention is not limited to auto-regressive fits and persons of ordinary skill in the art should appreciate that any desirable method, including matrix methods, may be used to determine (at 310) the product-specific model errors.

In one embodiment, the product-specific model errors are determined (at 310) using data acquired from previously processed workpieces. For example, the product-specific model errors may be determined (at 310) using data acquired from workpieces that were processed during a sliding time window so that only the most recently acquired data is used. Alternatively, the product-specific model errors may be determined (at 310) using data acquired from a fixed number of recently processed workpieces. In this embodiment, data associated with the least recently processed workpiece is dropped when data associated with a new workpiece is acquired. In cases where no data is available for a particular product, the product-specific model error may be determined (at 310) by setting it to zero or using a best guess based upon an aggregate of tool drift errors associated with other products having similar characteristics. The product that will be formed using the current workpiece is determined (at 320). For example, a product number associated with a workpiece may be used to determine (at 320) the product that will be formed using the current workpiece.

One or more input parameters for a process model used to form the product are determined (at 330) based on the product-specific model errors associated with the product to be formed on the current workpiece. For example, a deposition process model equation $T=Rt$ may be used to determine a thickness (T) of a layer formed by deposition tool having a deposition rate (R) and a deposition time (t). The deposition time (t) may be increased or decreased based upon the determined product-specific model error to achieve a target value of a thickness (T). For another example, a polishing process model equation $\Delta T=Pt$ may be used to determine a change in a thickness, $\Delta T$, of a layer polished by polishing tool having a removal rate (P) and a polishing time (t). The polishing time (t) may be increased or decreased based upon the determined product-specific model error to achieve a target value of the change in the thickness, $\Delta T$. For yet another example, a lithography process model equation $CD=Bt$ may be used to determine a critical dimension (CD) of a feature formed by a lithography tool having a lithography parameter (B) and an exposure time (t). The exposure time (t) may be increased or decreased based upon the determined product-specific model error to achieve a target value of the critical dimension (CD).

The workpiece is processed (at 340) and metrology data is collected (at 350). For example, as discussed above, the metrology data may include data indicative of one or more output parameters. If it is determined (at 360) that additional workpieces remain to be processed (at 340), then the product-specific model errors may be modified (at 370). In one embodiment, modifying (at 370) the product-specific model errors includes providing the collected metrology data to a control unit, such as the control unit 140 shown in FIG. 1, and calculating the product-specific model errors at least in part based upon the collected metrology data. If it is determined (at 360) that no additional workpieces remain to be processed (at 340), the method 300 ends (at 380).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a plurality of product model errors associated with a corresponding one of a plurality of products; and
   determining at least one input parameter for a process model to be used in processing a workpiece to form one of the plurality of products based upon the product model error associated with the product to be formed on the workpiece.

2. The method of claim 1, wherein determining the plurality of product model errors comprises determining the product to be formed by processing the workpiece.

3. The method of claim 1, wherein determining the plurality of product model errors comprises determining the plurality of product model errors based upon at least one output parameter associated with at least one previously processed workpiece.

4. The method of claim 3, wherein determining the plurality of product model errors based upon the at least one output parameter comprises measuring the at least one output parameter.

5. The method of claim 3, wherein determining the plurality of product model errors based upon the at least one output parameter associated with the at least one previously processed workpiece comprises determining the plurality of product model errors based upon at least one output parameter associated with at least one workpiece processed within at least one of a selected time period and a selected number of previously processed workpieces.

6. The method of claim 5, wherein determining the plurality of product model errors comprises determining the plurality of product model errors by applying an auto-regression analysis to the output parameters associated with the previously processed products.

7. The method of claim 3, wherein determining the at least one input parameter for the process model comprises determining the at least one input parameter using a process model equation that relates the at least one output parameter and the at least one input parameter.

8. The method of claim 7, wherein determining the at least one input parameter comprises inverting the process model equation.

9. The method of claim 1, further comprising determining at least one initial product model error.

10. The method of claim 9, wherein determining the at least one initial product model error comprises setting the at least one initial product model error equal to zero or an estimate of the initial product model error.

11. The method of claim 1, further comprising processing the workpiece using the processing model with the at least one determined input parameter.

12. The method of claim 11, further comprising measuring at least one output parameter associated with the processed workpiece.

13. The method of claim 12, further comprising modifying at least one input parameter associated with at least one tool drift error based upon the at least one measured output parameter.

14. An apparatus, comprising:
    means for determining a plurality of product model errors associated with a corresponding one of a plurality of products; and
    means for determining at least one input parameter for a process model to be used in processing a workpiece to form one of the plurality of products based upon the product model error associated with the product to be formed on the workpiece.

15. An apparatus, comprising:
    a processing tool for processing workpieces to form one of a plurality of products; and
    a control unit configured to:
    determine a plurality of product model errors associated with a corresponding one of a plurality of products; and
    determine at least one input parameter for a process model to be used in processing a workpiece in the processing tool to form one of the plurality of products based upon the product model error associated with the product to be formed on the workpiece.

16. The apparatus of claim 15, wherein the control unit is configured to determine the product to be formed by processing the workpiece.

17. The apparatus of claim 15, further comprising a metrology tool for measuring at least one output parameter associated with workpieces processed in the processing tool, and wherein the control unit is configured to determine the plurality of product model errors based upon at least one output parameter associated with at least one previously processed workpiece.

18. The apparatus of claim 17, wherein the control unit is configured to determine the plurality of product model errors based upon at least one output parameter associated with at least one workpiece processed within at least one of a selected time period and a selected number of previously processed workpieces.

19. The apparatus of claim 18, wherein the control unit is configured to determine the plurality of product model errors by applying an auto-regression analysis to the output parameters associated with the previously processed products.

20. The apparatus of claim 17, wherein the control unit is configured to determine the at least one input parameter using a process model equation that relates the at least one output parameter and the at least one input parameter.

21. The apparatus of claim 20, wherein the control unit is configured to invert the process model equation.

22. The apparatus of claim 15, wherein the control unit is configured to determine at least one initial product model error.

23. The apparatus of claim 22, wherein the control unit is configured to set the at least one initial product model error equal to zero or an estimate of the initial product model error.

24. The apparatus of claim 17, wherein the processing tool is configured to process the workpiece using the processing model with the at least one determined input parameter.

25. The apparatus of claim 24, wherein the metrology tool is configured to measure at least one output parameter associated with the processed workpiece.

26. The apparatus of claim 25, wherein the control unit is configured to modify at least one product model error based upon the at least one measured output parameter.

* * * * *